United States Patent [19]

Velazquez et al.

[11] Patent Number: 5,568,142
[45] Date of Patent: Oct. 22, 1996

[54] HYBRID FILTER BANK ANALOG/DIGITAL CONVERTER

[75] Inventors: Scott R. Velazquez, Somerville, Mass.; Truong O. Nguyen, Madison, Wis.; Steven R. Broadstone, Woburn, Mass.

[73] Assignee: Massachusetts Institute of Technology, Cambridge, Mass.

[21] Appl. No.: 326,474

[22] Filed: Oct. 20, 1994

[51] Int. Cl.$^6$ ...................................................... H03M 1/00
[52] U.S. Cl. ........................ 341/126; 341/144; 341/155
[58] Field of Search ..................................... 341/155, 144, 341/141, 131, 126; 381/37

[56] References Cited

U.S. PATENT DOCUMENTS

| | | | |
|---|---|---|---|
| 5,191,305 | 3/1993 | Frost et al. | 333/202 |
| 5,392,044 | 2/1995 | Kotzin et al. | 341/155 |
| 5,412,690 | 5/1995 | Kotzin et al. | 375/256 |
| 5,465,072 | 11/1995 | Atarodi | 330/254 |

OTHER PUBLICATIONS

A. Petraglia, et al., "Design of Magnitude Preserving Analog–to–Digital Converter," *IEICE Trans. Fundamentals,* E76–A(2):149–155 (Feb. 1993).

A. Petraglia, et al., "High–Speed A/D Conversion Incorporating a QMF Bank," *IEEE Trans. on Instrumentation and Measurement,* 41(3):427–431 (Jun. 1992).

A. Petraglia, et al., "QMF–Based A/D Converters:Overview and New Results," *Proc. Int. Conf. on Analogue to Digital and Digital to Analogue Conversion, University College of Swansea,* UK, pp. 112–117, (Sep. 1991).

A. Petraglia, et al., "High Speed AD Conversion Using QMF Banks," *Proceedings of IEEE International Symposium on Circuits and Systems* (1990).

S. R. Velazquez, et al., "A Hybrid Filter Bank Approach to Analog–to–Digital Conversion," *IEEE–SP International Symposium on Time–Frequency and Time–Scale Analysis* (Oct. 25–28, 1994) Philadelphia, PA.

*Primary Examiner*—Jeffrey A. Gaffin
*Assistant Examiner*—Jason L. W. Kost
*Attorney, Agent, or Firm*—Hamilton, Brook, Smith & Reynolds, P.C.

[57] ABSTRACT

A hybrid filter bank analog-to-digital converter includes continuous-time analysis filters and discrete-time synthesis filters. The continuous-time analysis filters partition a continuous-time wideband input signal into continuous-time subband signals. An analog-to-digital converter bank quantizes the subband signals at a low data rate. A bank of upsamplers increases the data rate of the quantized subband signals. A bank of discrete-time synthesis filters processes the upsampled subband signals, generating signals which are the discrete-time approximation of the continuous-time subband signals. The subband signals may be recombined into a discrete-time wideband signal which is the discrete-time approximation of the continuous-time wideband input signal. The linearity errors, analog-to-digital converter mismatches and quantization noise are not compounded between the frequency bands, thereby increasing resolution. The system may also include compensators for compensating for non-linear behavior in the analog-to-digital converters and may include application-specific processors for further processing of the compensated subband signals. An alternative embodiment employs discrete-time analysis filters and continuous-time synthesis filters for digital-to-analog conversion.

49 Claims, 7 Drawing Sheets

FIG. 7

HYBRID FILTER BANK ANALOG/DIGITAL CONVERTER

GOVERNMENT SUPPORT

The Government has rights in this invention pursuant to Contract No. F19628-90-C-0002 awarded by the United States Air Force.

BACKGROUND OF THE INVENTION

The rapid expansion of digital signal processing hardware and software has dramatically increased the demand for high-speed and high-resolution analog-to-digital converters. The most popular techniques for analog-to-digital conversion to date include successive approximation, sigma-delta, sub-ranging, flash, and time-interleaving.

The advancement of analog-to-digital converter technology involves a trade-off between sampling rate in samples per second (Sa/s) and resolution in bits. Sigma-delta converters currently provide high resolution (20 bits) at relatively low sampling rates (10 kSa/s) while time-interleaved converters provide low resolution (8 bits) at high sampling rates (8 GSa/s). The remaining techniques including successive approximation (100 kSa/s at 16 bits resolution), sub-ranging (1 MSa/s at 14 bits resolution), and flash (100 MSa/s at 10 bits resolution), span the range of sampling rate, resolution, and cost between the time-interleaving and sigma-delta techniques.

Recently, manufacturers began studying and perfecting time-interleaved analog-to-digital conversion. In this technique, a bank of time-multiplexed analog-to-digital converters with low sampling rates are combined to realize a single high-speed, high-resolution analog-to-digital converter. The primary drawback of time-interleaved analog-to-digital conversion is that linearity errors and mismatches between each of the converters in the bank are compounded across the full bandwidth of the device, limiting the resolution of the system. Time-interleaving is also prone to timing errors because it requires very accurate interleaved clock signals which limits the speed and resolution of the system and which introduces harmonic distortion. In addition, a voltage offset between two converters in the bank may cause the converters to digitize the same input voltage to different codes. Since the converters output data sequentially, the output exhibits an error signal having a period equivalent to the sample period of a single converter, but the frequency content can increase because each cycle of the error contains a number of offset errors equivalent to the number of converters in the bank. Therefore, this source of error introduces harmonic distortion spurs that limit the effective resolution of the system. A difference in voltage gain between two converters also causes each converter to digitize the same input voltage to a different code. The magnitude of the error grows as the input voltage grows. Overcoming these fundamental limitations is difficult because it requires reduction of error for each converter. The gain and offset of an individual converter can be adjusted with external resistors and the remaining harmonic distortion can be reduced with dynamic compensation techniques. However, the remaining linearity errors of each converter are still compounded across the full bandwidth of the system.

Discrete-time Quaudrature Mirror Filter (QMF) banks have been employed in analog-to-digital conversion techniques as described in:

Antonio Petraglia and Sanjit K. Mitra, "High-Speed A/D Conversion Incorporating a QMF Bank," *IEEE Transactions on Instrumentation and Measurement,* 41(3):427–431 (Jun., 1992).

In this system, discrete-time switched-capacitor analysis filters decompose the wideband input signal into several contiguous frequency subbands. An individual analog-to-digital converter is assigned to each subband. All converters are driven by a common clock. The subbands are allocated certain quantization bits thereby allowing separate control of resolution in each subband. Discrete-time finite impulse response synthesis filters reconstruct each subband, cancelling the aliasing caused by other subbands. Therefore, the errors associated with a particular subband are not compounded with errors of other subbands as in time-interleaved analog-to-digital conversion. In addition, the discrete-time QMF bank approach does not require extremely accurate time-skewed clock signals.

The primary disadvantage of the discrete-time QMF bank analog-to-digital converter is that the switched-capacitors introduce switching noise that can limit the signal-to-noise ratio and thereby limit the resolution and speed of the system. Typical switched-capacitor filters have a signal-to-noise ratio of about 85 dB and are limited to sampling rates of about 150 kSa/sec. This limits the bandwidth of the discrete-time QMF bank.

SUMMARY OF THE INVENTION

The present invention is directed to an apparatus and method for high-speed high-resolution analog/digital conversion. Note that the term "analog/digital" as used herein includes both analog-to-digital and digital-to-analog conversion. In the present invention, converter quantization noise and linearity errors are confined to each individual subband and are therefore not compounded. The converter bank is driven by a single clock, simplifying timing constraints. Synthesis filters compensate for remaining timing errors.

For subband coding applications such as compression or adaptive array processing, the present invention is capable of direct channelization without the requirement of additional hardware. The present invention is amenable to non-uniform channel bandwidths and can be implemented in very large scale integration (VLSI). The invention overcomes the limitations and disadvantages of the conventional discrete-time QMF array architectures.

In accordance with the present invention, a converter bank is incorporated into a hybrid system having, in the case of an analog-to-digital converter, continuous-time analysis filters and discrete-time synthesis filters. Integration of continuous-time filters and discrete-time filters does present design problems, but they have been overcome with this invention. Continuous-time analysis filters improve system speed and resolution by overcoming the limitations of switched-capacitor filters used in the prior art. The continuous-time analysis filters partition a continuous-time wideband input signal into continuous-time subband signals. In a preferred embodiment, an analog-to-digital converter, a rate changer, and a discrete-time synthesis filter are provided for each subband. The individual analog-to-digital converters in the array quantize the subband signals into binary bits. The rate changer, in the form of an upsampler or downsampler increases or decreases the data rate of the quantized subband signal. The discrete-time synthesis filters process the subband signal, generating a signal which is the discrete-time approximation of the continuous-time subband signal.

An adder may be provided for recombining the discrete-time subband signals into a discrete-time wideband signal which is the discrete-time approximation of the continuous-time wideband input signal. A discrete-time compensator may compensate for non-linear behavior in the analog-to-digital converters. The synthesis filters compensate for gain error, aliasing error and non-linear phase in the continuous-time analysis filters. Application-specific processors may be included for further processing of the subband signals either before or after conversion to discrete-time. Non-uniform subband channel bandwidths may be employed as well as uniform subband channel bandwidths. A tree-structure architecture may be implemented to simplify the multiple-channel parallel architecture into a hierarchy of multiple-channel systems. A wavelet-type structure may be implemented for systems requiring non-uniform channel bandwidths.

An alternative embodiment for digital-to-analog conversion employs discrete-time analysis filters to partition a wideband discrete-time input signal into subbands. Each subband is assigned its own digital-to-analog converter and subband processor. Continuous-time synthesis filters process the subband signal. The subband signals may be recombined to form a wideband, continuous-time output signal.

In a preferred embodiment of the invention, the hybrid system comprises an M-channel, maximally-decimated, parallel, uniform bandwidth architecture, where M represents an integer. In a maximally-decimated embodiment, each subband converter samples at 1/M the effective sampling rate of the system. The wideband input signal is partitioned into M subband signals by M analysis filters. For the digital-to-analog conversion case, each subband signal is then downsampled by a factor of M. Each subband signal is then passed through a converter, either analog-to-digital or digital-to-analog and processed. For the analog-to-digital case, the subband signal is then upsampled by a factor of M. Next, the subband signal is processed in a bank of M synthesis filters and recombined to form a wideband output signal.

A more efficient implementation employs polyphase decomposition to interchange the order of analysis filtering and downsampling in the digital-to-analog case, or upsampling and synthesis filtering in the analog-to-digital case. This allows for filtering at the subband data rate. To reduce the effects of aliasing in the maximally-decimated system and to improve resolution, oversampling may be used. A subset of the analog/digital converters in the bank may operate at higher resolution than the remaining analog/digital converters for applications requiring greater dynamic range at select subbands. The subbands may be mixed down to baseband or up to higher frequencies to alleviate the requirement for high-speed, high-precision sample and hold circuitry in the analog/digital converters.

An optimization algorithm determines the analysis filters and the synthesis filters in an iterative process which incrementally adjusts the analysis and synthesis filters such that the system distortion function converges on a perfect delay and such that the system aliasing functions converge on zero.

BRIEF DESCRIPTION OF THE DRAWINGS

FIGS. 4A and 4B are block diagrams of equivalent methods for filtering.

FIGS. 4C and 4D are block diagrams of equivalent methods for filtering.

DETAILED DESCRIPTION OF THE PREFERRED EMBODIMENTS

The hybrid filter bank of the present invention is a novel class of filter bank which is less understood than the all-discrete-time class. The complexity of the hybrid filter bank lies in the relationship between the continuous-time analysis filters and the discrete-time synthesis filters.

Figure 1:
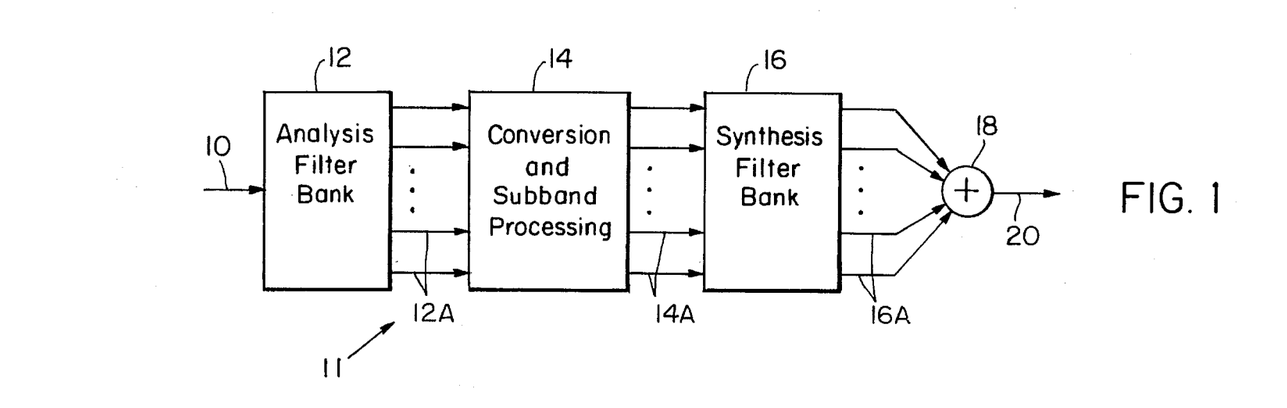
FIG. 1 is a block diagram of a general hybrid filter bank for analog-to-digital or digital-to-analog conversion in accordance with the present invention.

FIG. 1 is a block diagram of a general hybrid filter bank analog/digital converter 11. An analysis filter bank 12 partitions a wideband input signal 10 into subband signals 12A. Each subband signal 12A is assigned its own analog/digital converter and subband processor 14 where the subband signal 12A undergoes conversion and processing. A synthesis filter bank 16 further processes the converted and processed subband signals 14A. The synthesized subband signals 16A are combined at an optional adder 18 to form a wideband output signal 20. For analog-to-digital conversion, continuous-time analysis filters 12 and discrete-time synthesis filters 16 are employed and the synthesis bank 16 may include data rate changers to increase or decrease the data rate. For digital-to-analog conversion, discrete-time analysis filters 12 and continuous-time synthesis filters 16 are employed and the analysis bank 12 may include data rate changers for increasing or decreasing the data rate. The data rate changers are either upsamplers, which increase the data rate by inserting zeros between the samples, or downsamplers, which decrease the sampling rate by periodically discarding samples.

The embodiment of FIG. 1 provides for subband channelization of the wideband input signal 10 at signals 16A or 12A without the requirement of additional hardware. This is particularly useful in applications such as adaptive array processing and compression techniques that perform subband coding.

Figure 2:
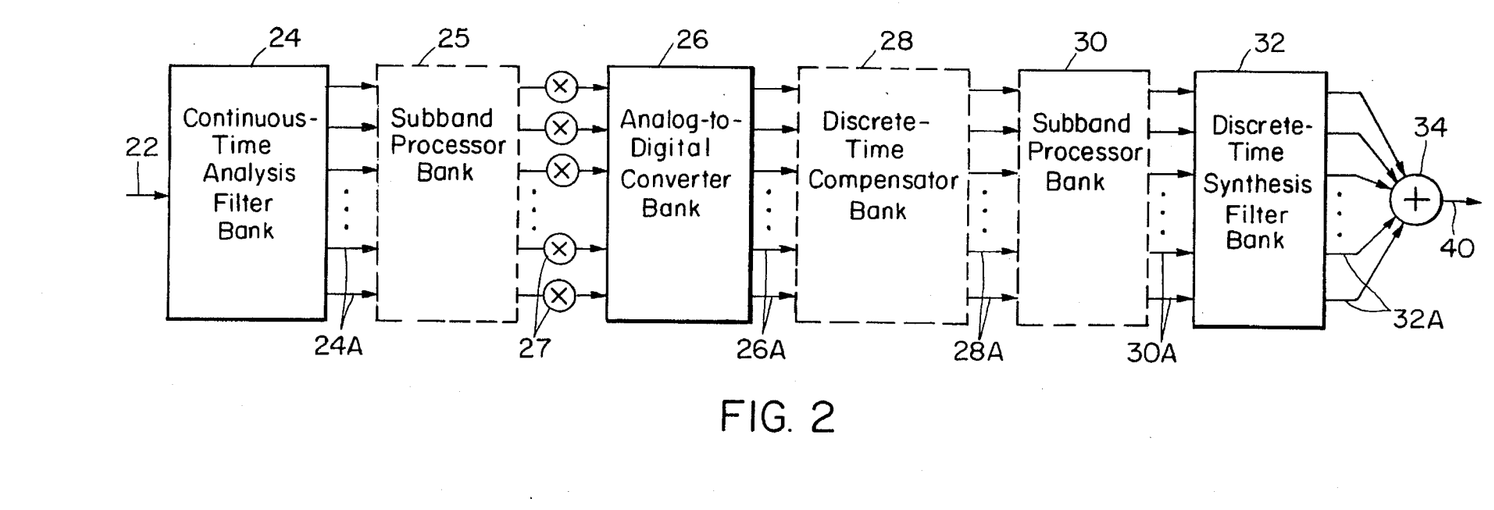
FIG. 2 is a block diagram of a hybrid filter bank analog-to-digital converter having subband processor banks and a discrete-time compensation bank for compensating for non-ideal analog behavior in accordance with the present invention.

A hybrid filter bank analog-to-digital converter with discrete-time compensation is shown in the block diagram of FIG. 2. Rather than filtering the continuous-time wideband input signal 22 with discrete-time switched-capacitors before analysis filtering in discrete-time as does the prior art, the embodiment of FIG. 2 overcomes the limitations of the prior art by using continuous-time analysis filters 24.

A continuous-time wideband input signal 22 is partitioned into continuous-time subband signals 24A by the continuous-time analysis filter bank 24. A bank of analog-to-digital converters 26, one converter for each subband, converts the continuous-time subband signals 24A into discrete-time subband signals 26A. An optional discrete-time compensator bank 28 may be employed for compensating for non-linear behavior in the analog-to-digital converters 26. The compensated discrete-time subband signals 28A may be further processed by an optional discrete-time subband processor bank 30 for frequency-dependent processing of individual subband data streams, for example, adaptive-array processing and compression. Similarly, the subband processors 25 may optionally be employed for processing the continuous-time subband signals 24A before quantization by the analog-to-digital converters 26. The resultant signals 30A are further processed by the discrete-time synthesis filter bank 32 which may include data rate changers for increasing or decreasing the data rate. The synthesis filters 32 compensate for non-linear phase and gain errors in the analysis filters 24 and also cancel aliasing.

The output 32A of the discrete-time synthesis filter bank 32 is the discrete-time approximation of the continuous-time subband inputs 24A. The synthesis filter bank 32 processes the signals so that upon recombination at an optional adder 34, aliasing is cancelled and the subband signals 32A are combined into a wideband discrete-time output signal 40 which is the discrete-time approximation of the wideband continuous-time input signal 22.

The subbands 24A may be mixed down to baseband with mixers 27 before sampling at the analog-to-digital converters 26 to alleviate the requirement for high-speed, high-precision sample-and-hold circuitry in the analog-to-digital converters 26. This allows for analog-to-digital conversion at a lower sampling rate, and increases the dynamic range of the system by alleviating the wide analog bandwidth constraints of the converter bank. An analogous structure may be used to mix the subband signals up to higher frequencies after conversion for the digital-to-analog case.

Figure 3:
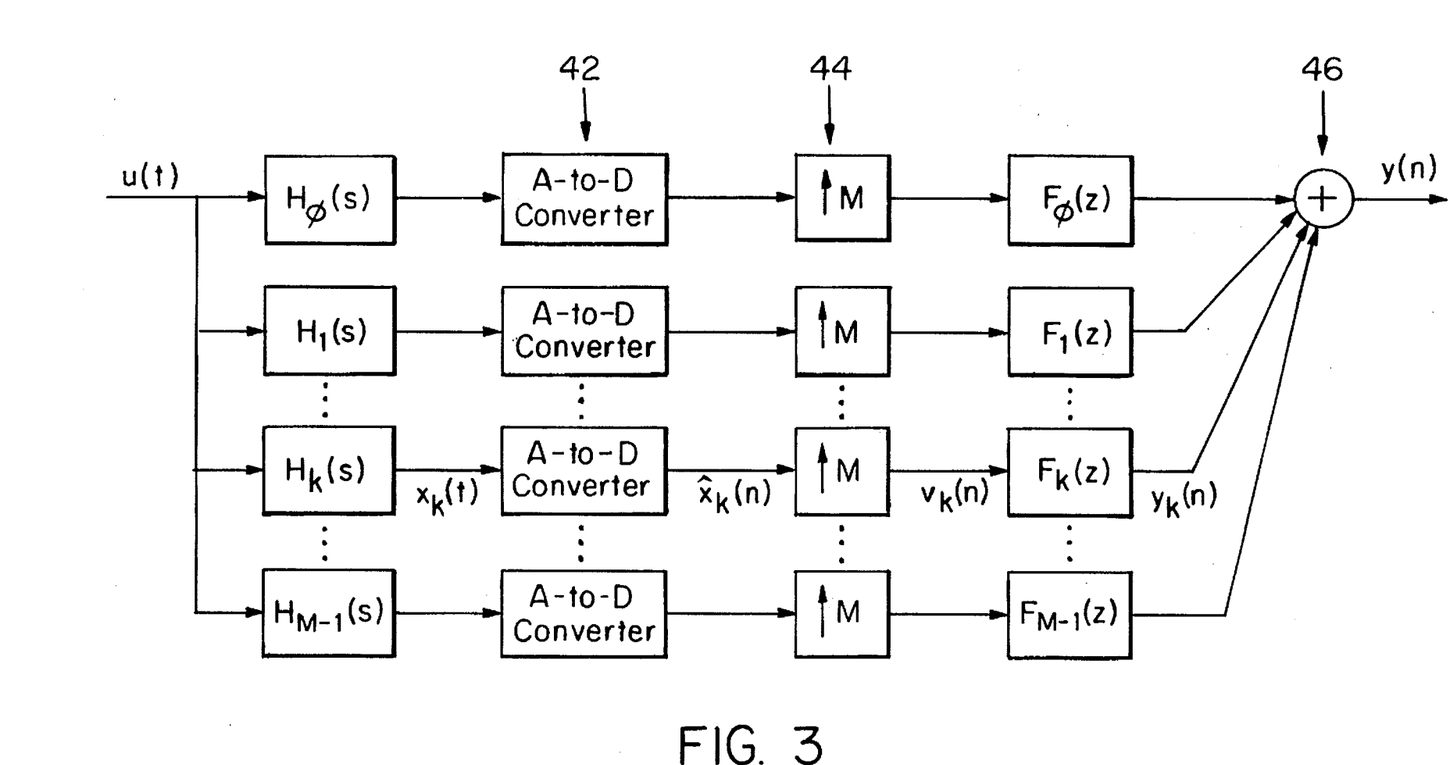
FIG. 3 is a block diagram of an M-channel, maximally-decimated, parallel, uniform channel width, hybrid filter bank analog-to-digital converter in accordance with the present invention.

FIG. 3 is a block diagram representing an M-channel, maximally-decimated, parallel, uniform channel, hybrid filter bank analog-to-digital converter. Continuous-time analysis filters $H_k(s)$ partition a wideband continuous-time input $u(t)$ into M consecutive, uniform bandwidth subband signals $x_k(t)$. Each continuous-time subband signal $x_k(t)$ is converted to discrete-time by an analog-to-digital converter 42 sampling at a subband rate of $1/M$ multiplied by the effective sample rate of the system. Each discrete-time converted subband signal $\hat{x}_k(n)$ is upsampled 44 by a factor of M. Each upsampled discrete-time subband signal $v_k(n)$ is processed by a discrete-time synthesis filter $F_k(z)$. The resulting signals $y_k(n)$ are optionally combined at an adder 46 to form a wideband discrete-time output signal $y(n)$.

A mathematical derivation of the properties of the hybrid filter bank analog-to-digital converter shown in FIG. 3 will now be described. The first goal is to determine the input/output function for this architecture which is derived below in equations 1 through 9. The second goal is to find expressions for the Fourier transform of the synthesis filters $F_k(e^{j\omega})$ that provide perfect reconstruction given a set of analysis filters $H_k(j\Omega)$ which are defined in equations 10 through 16, with an example given for M=2 at equations 17–22.

In the frequency domain, the result of filtering the input $U(j\Omega)$, bandlimited to $\Omega_n$ rad/sec, through each analysis filter $H_k(j\Omega)$ is $X_k(j\Omega)$, $$X_k(j\Omega) = U(j\Omega)H_k(j\Omega). \quad (1)$$

In the time-domain, analog-to-digital converter 42 errors can be modeled as gain errors $a_k$ and DC offset errors $b_k$, $$\hat{x}_k[n] = (1+a_k)x_k[n] + b_k. \quad (2)$$

The effects of analog-to-digital converter errors are seen in the frequency domain along with aliasing error due to undersampling, where T is the sampling period, $T = M\pi/\Omega_n$, $$\hat{X}_k(e^{j\omega}) = \frac{1+a_k}{T} \sum_{l=0}^{M-1} X_k\left(\frac{j\omega}{T} - \frac{j2\pi l}{T}\right) + \quad (3)$$

$$b_k \sum_{l=0}^{M-1} 2\pi\delta(\omega - 2\pi l), \; 0 < \omega < 2\pi.$$

Substituting for $X_k(j\Omega)$, $$\hat{X}_k(e^{j\omega}) = \frac{1+a_k}{T} \sum_{l=0}^{M-1} U\left(\frac{j\omega}{T} - \frac{j2\pi l}{T}\right) H_k\left(\frac{j\omega}{T} - \frac{j2\pi l}{T}\right) + \quad (4)$$

$$b_k \sum_{l=0}^{M-1} 2\pi\delta(\omega - 2\pi l),$$

$$0 < \omega \leq (M-1)2\pi.$$

The result of upsampling by a factor of M is represented as $$V_k(e^{j\omega}) \cdot V_k(e^{j\omega}) = \hat{X}_k(e^{j\omega M}) \quad (5)$$

$$= \frac{1+a_k}{T} \sum_{l=0}^{M-1} U\left(\frac{j\omega M}{T} - \frac{j2\pi l}{T}\right) H_k\left(\frac{j\omega M}{T} - \frac{j2\pi l}{T}\right) +$$

$$b_k \sum_{l=0}^{M-1} 2\pi\delta(\omega M - 2\pi l),$$

$$0 < \omega \leq \frac{(M-1)}{M} 2\pi.$$

The result of filtering $V_k(e^{j\omega})$ through synthesis filters $F_k(e^{j\omega})$ is represented as $Y_k(e^{j\omega})$, $$Y_k(e^{j\omega}) = F_k(e^{j\omega}) V_k(e^{j\omega}) \quad (6)$$

$$= \frac{1+a_k}{T} \sum_{l=0}^{M-1} F_k(e^{j\omega})U\left(\frac{j\omega M}{T} - \frac{j2\pi l}{T}\right) H_k\left(\frac{j\omega M}{t} - \frac{j2\pi l}{T}\right) +$$

$$b_k \sum_{l=0}^{M-1} F_k(e^{j\omega})2\pi\delta(\omega M - 2\pi l).$$

The wideband output signal $Y(e^{j\omega})$ is the sum of all subband signals $Y_k(e^{j\omega})$, $$Y(e^{j\omega}) = \sum_{k=0}^{M-1} Y_k(e^{j\omega}). \quad (7)$$

Substituting for $Y_k(e^{j\omega})$, the reconstructed wideband output signal $Y(e^{j\omega})$ is $$Y(e^{j\omega}) = \sum_{k=0}^{M-1} \frac{1+a_k}{T} \sum_{l=0}^{M-1} F_k(e^{j\omega}) U\left(\frac{j\omega M}{T} - \frac{j2\pi l}{T}\right) \cdot \left(H_k\left(\frac{j\omega M}{T} - \frac{j2\pi l}{T}\right)\right) + \tag{8}$$

$$\sum_{k=0}^{M-1} b_k \sum_{l=0}^{M-1} F_k(e^{j\omega}) 2\pi\delta(\omega M - 2\pi l).$$

Rearranging the summation gives the output $Y(e^{j\omega})$, in terms of the input $U(j\Omega)$, the analysis filters $H_k(e^{j\omega})$ and the synthesis filters $F_k(e^{j\omega})$.

$$Y(e^{j\omega}) = \sum_{l=0}^{M-1} U\left(\frac{j\omega M}{T} - \frac{j2\pi l}{T}\right) \cdot \tag{9}$$

$$\left(\sum_{k=0}^{M-1} \frac{(1+a_k)}{T} F_k(e^{j\omega}) H_k\left(\frac{j\omega M}{T} - \frac{j2\pi l}{T}\right)\right) +$$

$$\sum_{k=0}^{M-1} b_k \sum_{l=0}^{M-1} F_k(e^{j\omega}) 2\pi\delta(\omega M - 2\pi l).$$

This expression is simplified by introducing functions $T_p(e^{j\omega})$ and $\beta$, $$Y(e^{j\omega}) = \sum_{p=0}^{M-1} U\left(\frac{j\omega M}{T} - \frac{j2\pi p}{T}\right) T_p(e^{j\omega}) + \beta, \tag{10}$$

where $$T_p(e^{j\omega}) = \sum_{k=0}^{M-1} \frac{(1+a_k)}{T} F_k(e^{j\omega}) H_k\left(\frac{j\omega M}{T} - \frac{j2\pi p}{T}\right), \tag{11}$$

$$0 < \omega \leq \frac{(M-1)}{M} 2\pi$$

and $$\beta = 2\pi \sum_{k=0}^{M-1} b_k F_k(e^{j\omega}) \sum_{p=0}^{M-1} \delta(\omega M - 2\pi p). \tag{12}$$

Equations 10, 11, and 12 describe the mathematical input/output function for the hybrid filter bank analog-to-digital converter on the interval $$0 < \omega \leq \frac{(M-1)}{M} 2\pi.$$

Perfect reconstruction occurs when the sole effect of the filter bank architecture is to introduce a delay, $$Y(e^{j\omega}) = Ae^{-j\omega d} U(e^{j\omega}). \tag{13}$$

Therefore, the distortion function $T_0(e^{j\omega})$ should correspond to a perfect delay, d, $$T_0(e^{j\omega}) = Ae^{-j\omega d}. \tag{14}$$

Also, the aliasing functions, $T_p(e^{j\omega})$ where $1 \leq p \leq M-1$, should be equal to zero, $$T_p(e^{j\omega}) = 0. \tag{15}$$

$\beta$ corresponds to DC offset errors in the analog-to-digital converters and should be zeroed by adjusting each analog-to-digital converter offset $b_k$ to zero.

$$\beta = 0. \tag{16}$$

Using these constraints, equation 11 can be solved as a system of simultaneous linear equations for the Fourier transform of the desired synthesis filters $F_k(e^{j\omega})$ that provide perfect reconstruction given a set of analysis filters $H_k(e^{j\omega})$.

AS an example, for M=2, the input/output function is $$Y(e^{j\omega}) = U\left(\frac{j2\omega}{T}\right) T_0(e^{j\omega}) + U\left(\frac{j2\omega}{T} - \frac{j2\pi}{T}\right) T_1(e^{j\omega}) + \beta. \tag{17}$$

For perfect reconstruction, the distortion function should be equal to a perfect delay, $$T_0(e^{j\omega}) = \frac{1}{T}(1+a_0) F_0(e^{j\omega}) H_0\left(\frac{j2\omega}{T}\right) + \tag{18}$$

$$\frac{1}{T}(1+a_1) F_1(e^{j\omega}) H_1\left(\frac{j2\omega}{T}\right)$$

$$= e^{-j\omega d}, 0 < \omega \leq \pi,$$

and the aliasing function should be equal to zero, $$T_1(e^{j\omega}) = \frac{1}{T}(1+a_0) F_0(e^{j\omega}) H_0\left(\frac{j2\omega}{T} - \frac{j2\pi}{T}\right) + \tag{19}$$

$$\frac{1}{T}(1+a_1) F_1(e^{j\omega}) H_1\left(\frac{j2\omega}{T} - \frac{j2\pi}{T}\right)$$

$$= 0, 0 < \omega \leq \pi.$$

Also, the DC offset errors, $\beta$, should be set to zero $$\beta = 2\pi \sum_{k=0}^{1} b_k F_k(e^{j\omega})(\delta(\omega) + \delta(\omega - \pi)) = 0. \tag{20}$$

Solving the system of simultaneous equations above for $F_0(e^{j\omega})$ and $F_1(e^{j\omega})$, the Fourier transform of the synthesis filters that provide perfect reconstruction gives $$F_0(e^{j\omega}) = Ae^{-j\omega d} \frac{T}{1+a_0} \cdot \left(\frac{H_1\left(\frac{j2\omega}{T} - \frac{j2\pi}{T}\right)}{H_0\left(\frac{j2\omega}{T}\right) H_1\left(\frac{j2\omega}{T} - \frac{j2\pi}{T}\right) - H_1\left(\frac{j2\omega}{T}\right) H_0\left(\frac{j2\omega}{T} - \frac{j2\pi}{T}\right)}\right) \tag{21}$$

and $$F_1(e^{j\omega}) = Ae^{-j\omega d} \frac{T}{1+a_1} \cdot \left(\frac{H_0\left(\frac{j2\omega}{T} - \frac{j2\pi}{T}\right)}{H_1(e^{j\omega}) H_0\left(\frac{j2\omega}{T} - \frac{j2\pi}{T}\right) - H_0\left(\frac{j2\omega}{T}\right) H_1\left(\frac{j2\omega}{T} - \frac{j2\pi}{T}\right)}\right) \tag{22}$$

Discrete-time synthesis filters, $F_k(Z)$, are determined by calculating a system function that approximates the desired frequency responses, $F_k(e^{j\omega})$, using the optimization described below. The order of the synthesis filter is determined by the level of error that can be tolerated in the system. High-order synthesis filters reduce reconstruction errors because they more closely approximate the desired frequency responses than do low-order synthesis filters. The reverse structure of the hybrid filter bank analog-to-digital converter is the hybrid filter bank digital-to-analog converter which uses discrete-time analysis filters, downsamplers, an array of digital-to-analog converts and continuous-time synthesis filters. It can be shown that using the continuous-time and discrete-time filters designed for the hybrid filter bank analog-to-digital converter will result in the same reconstruction error as the hybrid filter bank digital-to-analog converter. The digital-to-analog converter is described below in conjunction with FIG. 6.

The optimization algorithm described below in conjunction with FIG. 7 calculates the optimal system delay d and formulates suitable analysis and synthesis filters which enable accurate reconstruction. A near-perfect reconstruction solution can be designed by approximating a discrete-time perfect reconstruction solution, but good approximations require high-order filters. The optimization algorithm described below calculates near-perfect-reconstruction hybrid filter banks that are not necessarily hardware intensive.

The algorithm has two sections, the analysis filter optimization, followed by the synthesis filter optimization. From a given lowpass continuous-time analysis filter, $H_0(s)$, the analysis filter optimization calculates the remaining bandpass analysis filters $H_k(s)$, $1 \leq k \leq M-1$, and the system delay, d, to minimize reconstruction error. The optimization calculates samples of the functions $T_p(e^{j\omega})$, $0 \leq p \leq M-1$, and iteratively adjusts the analysis filters $H_k(s)$, and system delay, d, such that the distortion function, $T_0(e^{j\omega})$ is as close to a perfect delay, $e^{j\omega d}$, as possible and the aliasing functions $T_p(e^{j\omega})$, for $1 \leq p \leq M-1$ are as close to zero as possible. The algorithm uses a least-squares error criterion with the Matlab™ multi-variable minimization algorithm fmins.

Given analysis filters $H_k(s)$ and system delay d, calculated above, the synthesis filter optimization calculates the synthesis filters $F_k(z)$ that minimize the reconstruction error. One method is the Matlab™ function invfreqz which calculates system functions $F_k(z)$ whose Fourier transforms approximate the ideal Fourier transforms. Such an algorithm is quick enough to provide a rough solution, but may not provide the highest accuracy reconstruction possible. This algorithm is used in the analysis filter optimization above to evaluate the aliasing functions $T^p(e^{j\omega})$.

Similar to the analysis filter optimization, the synthesis filter optimization iteratively adjusts the synthesis filters, $F_k(z)$, to minimize a least-squares error criterion in $T_p(e^{j\omega})$ with the Matlab™ multi-variable minimization algorithm fmins. The best results are obtained when the algorithm uses the analysis filters calculated in the analysis filter optimization above, but it also works for any set of analysis filters, enabling the use of standard filter types (such as Butterworth, Chebyshev, or Elliptic filters). The synthesis filter optimization also enables accurate calibration of the hardware system by optimizing the synthesis filters based on measurement of the hardware analysis filters.

Figure 4A:
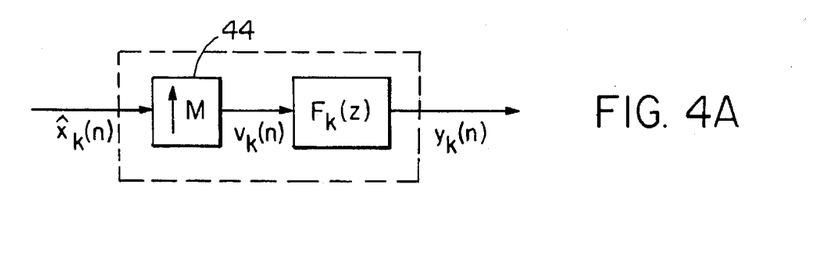
FIG. 4A is a representation of filtering following upsampling.
Figure 4B:
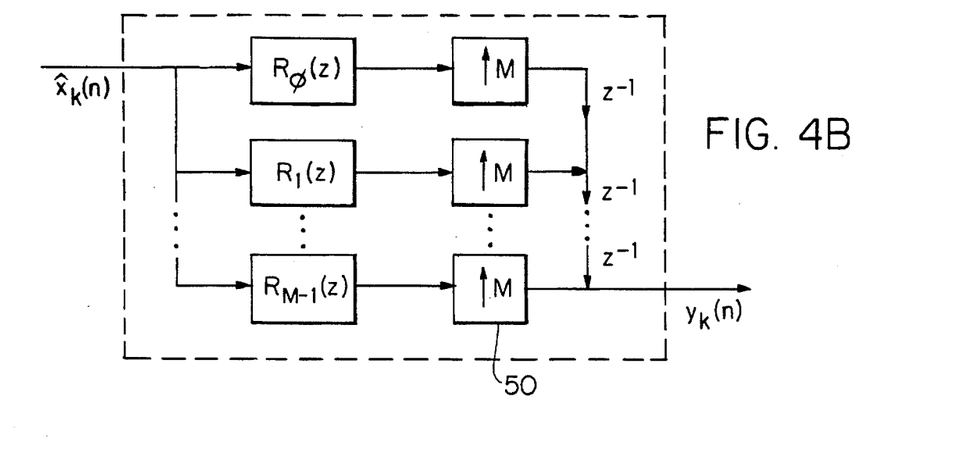
FIG. 4B shows an equivalent structure using polyphase decomposition to enable efficient filtering at the lower data rate prior to upsampling. In the analog-to-digital case, this can be used to enable efficient synthesis filtering at the lower data rate.

The technique of FIG. 3 requires synthesis filters $F_k(z)$ operating at the effective sample rate of the system, which can be extremely fast. The upsampler 48 and synthesis filter $F_k(z)$ combination from FIG. 3 is reproduced in FIG. 4A. FIG. 4B shows a polyphase decomposition technique which is the equivalent of the combination shown in FIG. 4A. Polyphase decomposition rearranges the order so that synthesis filtering $R_k(z)$ is performed before upsampling. Synthesis filtering $R_k(z)$ is performed at the lower sample rate of the analog-to-digital converters, which is 1/M multiplied by the effective sample rate of the system. Polyphase decomposition replaces each upsampler 44 and length L FIR synthesis filter $F_k$ with M length L/M filters $R_k(z)$ followed by M upsamplers 50. The process requires M filters for each subband, but each filter has fewer coefficients. A similar polyphase decomposition structure can be used to enable analysis filtering at the subband sample rate in the digital-to-analog case.

Figure 4C:
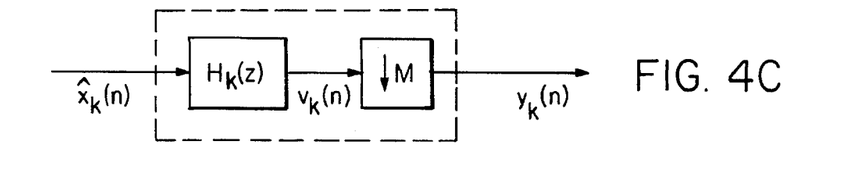
FIG. 4C is a representation of filtering followed by downsampling.
Figure 4D:
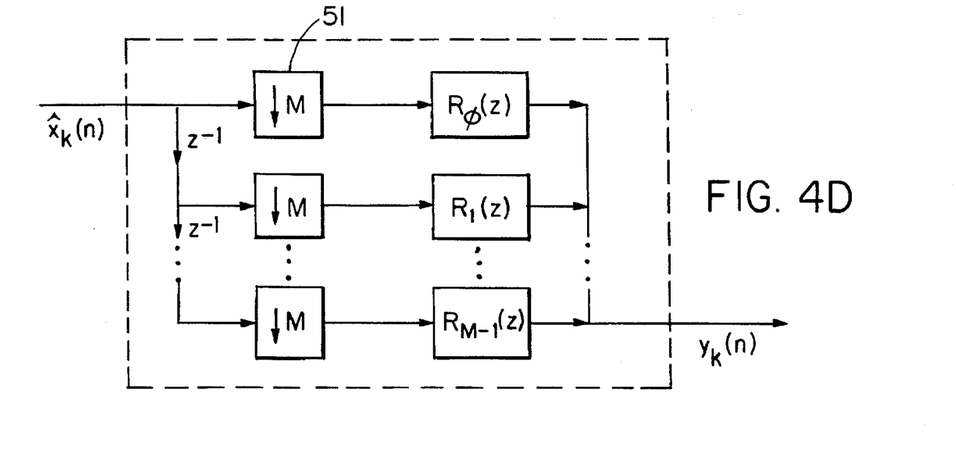
FIG. 4D shows an equivalent structure using polyphase decomposition to enable efficient filtering at the lower data rate after downsampling. In the digital-to-analog case, this can be used to enable efficient analysis filtering at the lower data rate.

In an oversampling system where the analog-to-digital converters are sampling at a rate higher than the effective sampling rate of the hybrid filter bank, downsampling may be needed after filtering and conversion as shown in FIG. 4C. FIG. 4D shows an embodiment for polyphase decomposition wherein the converted signal $\hat{x}_k(n)$ is first downsampled 51 to lower the data rate, and then filtered by synthesis filters $R_k(z)$. In this embodiment, the filtering $R_k(z)$ is performed at the lower data rate. In general, the polyphase filtering methods in FIGS. 4B and 4D may be used to enable filtering at a lower data rate by interchanging the order of data rate changing and filtering.

One technique for reducing aliasing is to increase analysis filter cut-off slope and stopband attenuation. However, this technique increases hardware complexity. Another improved technique is oversampling. The maximally-decimated architecture shown in FIG. 3 is, by definition, operating at the theoretical limit Nyquist sampling rate with no leeway for aliasing. Oversampling would widen the frequency channels allocated to each converter in the array and thus the channels would overlap. This places less emphasis on the analysis filters $H_k(s)$ to reduce aliasing, and relieves the sharp cut-off slope and high stopband attenuation constraints, thereby allowing lower order analysis filter $H_k(s)$ implementations with reduced hardware requirements. Oversampling also separates quantization noise from the signal and the noise is filtered out by the synthesis filters, reducing system noise and improving system resolution. Each factor of four in sampling speed improves resolution by 1 effective bit. In the analog-to-digital converter case, where oversampling is used, it may be necessary to downsample the converted subband signal after synthesis filtering because, in the oversampled system, the individual converters may be operating at a rate higher than the effective sampling rate of the entire system.

Figure 5A:
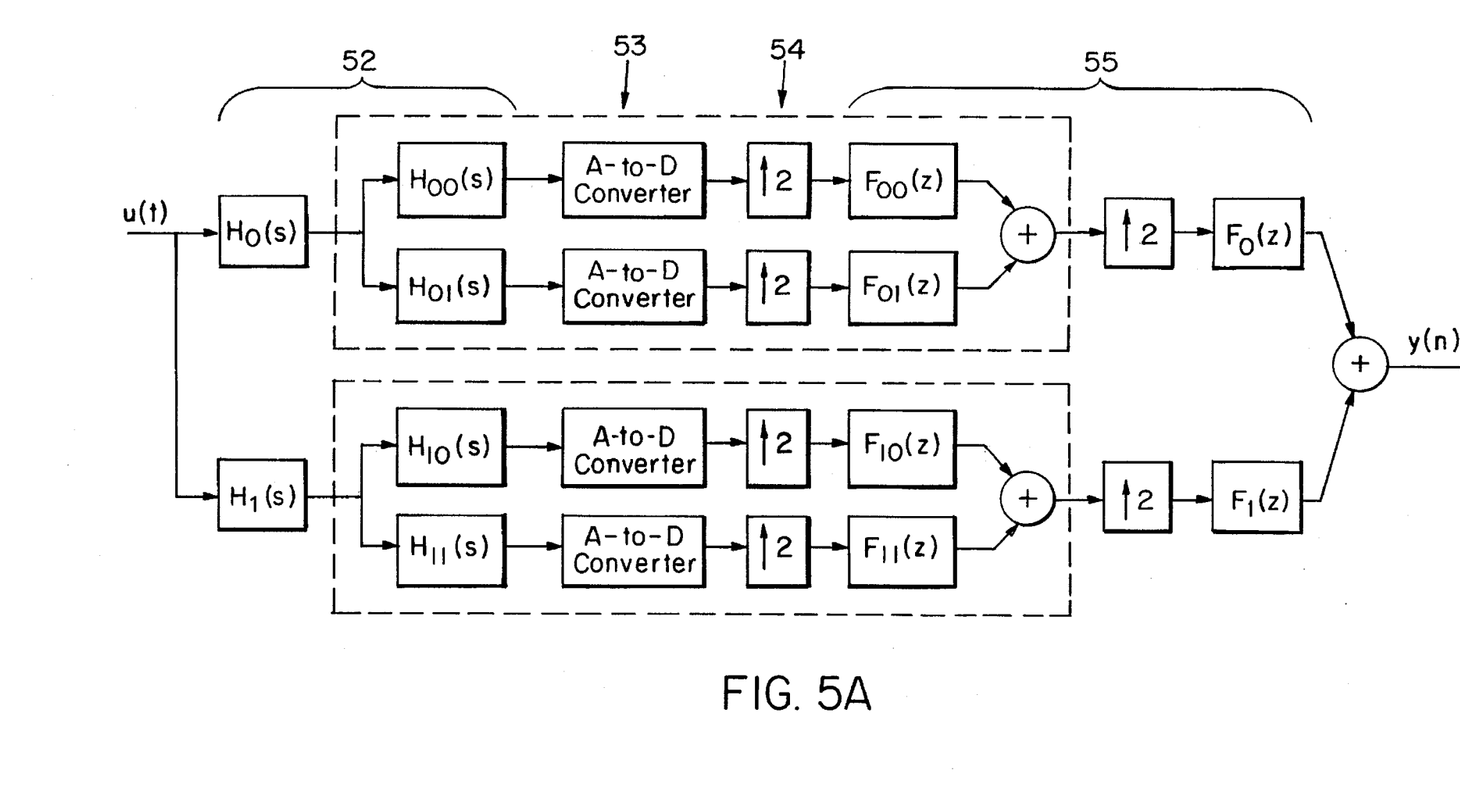
FIG. 5A is a block diagram of a tree-structured hybrid filter bank analog-to-digital converter.

The M-channel hybrid filter bank can be simplified to form a series of multiple-channel blocks arranged in a tree structure. This simplifies the optimization algorithm and design procedure. FIG. 5A is a block diagram of a two-channel tree structure for analog-to-digital conversion. The analysis filter bank 52 comprises hierarchical pairs of continuous-time analysis filters $H_0(s)$ and $H_1(s)$ which partition the input signal u(t) into subbands, the subbands being further partitioned by continuous-time analysis filters $H_{00}(s)$, $H_{01}(s)$, $H_{10}(s)$, $H_{11}(s)$. Each subband signal is converted to discrete-time 53, upsampled 54, and then processed and recombined in a hierarchical discrete time synthesis filter bank 55. Rather than optimizing an M-channel system, which can be prohibitively time-consuming, the optimization is reduced to a series of two-channel optimizations. This embodiment is not limited to two-channel blocks, nor is it limited to two levels of hierarchy. This technique may also be applied to digital-to-analog conversion.

Figure 5B:
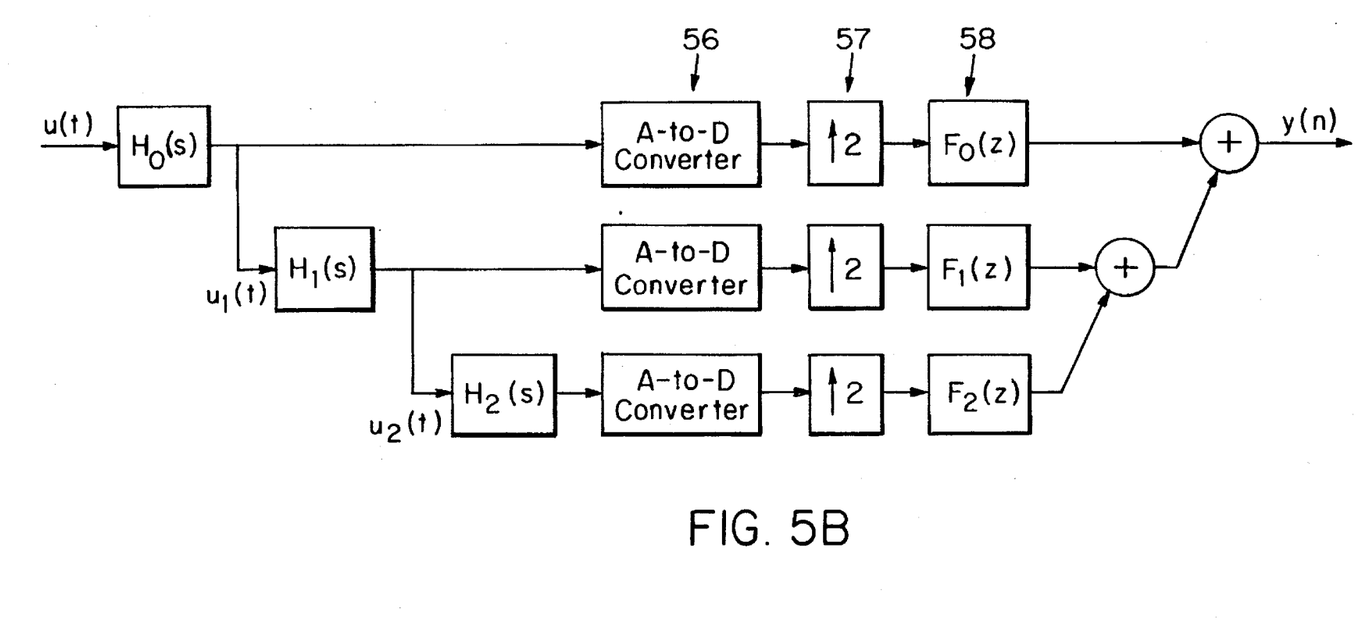
FIG. 5B is a block diagram of a wavelet-type hybrid filter bank analog-to-digital converter.

The invention may also be implemented in a wavelet-type structure as shown in FIG. 5B. The continuous-time input signal u(t) is partitioned into subband signals by a continuous-time analysis filter $H_0(s)$. One of the subbands $u_1(t)$ is further partitioned into smaller subbands $u_2(t)$ by an analysis filter $H_1(s)$ and each subband signal is converted to discrete-time 56 and upsampled 57. The subbands are recombined in a wavelet-structured synthesis filter bank 58. This structure is applicable in systems requiring non-uniform channel bandwidths for multi-resolution or wavelet analysis. This technique is appropriate for example, in audio applications, which require a wider bandwidth at lower frequencies.

The invention may also include higher resolution analog-to-digital converters in a subset of the subbands for applications requiring additional dynamic range at select frequency bands. For example, certain subbands may employ a converter with a higher number of quantization bits. Alternatively, certain subbands may be sampled at higher rates.

Figure 6:
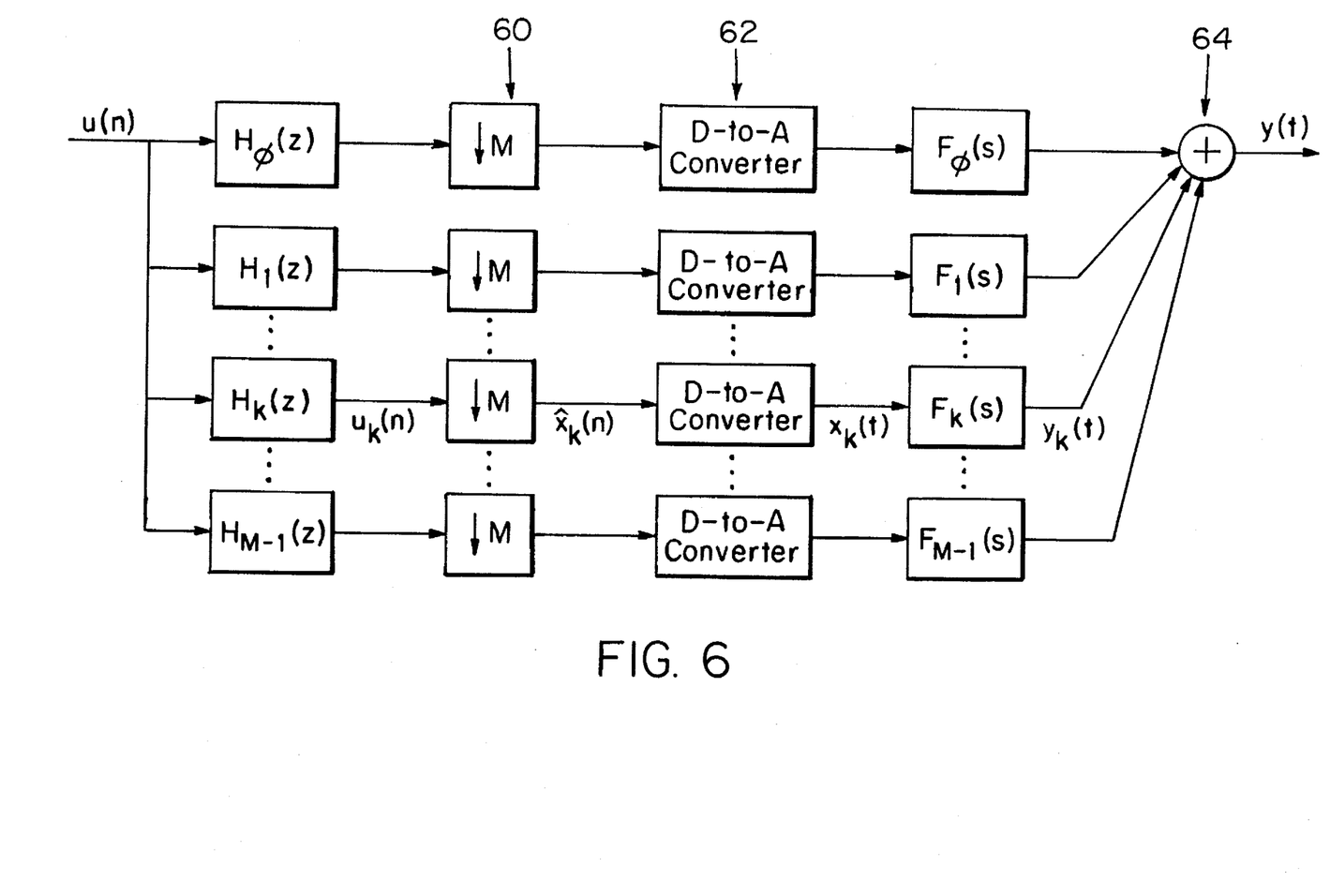
FIG. 6 is a block diagram of a hybrid filter bank digital-to-analog converter in accordance with the present invention.

FIG. 6 is a block diagram of a M-channel maximally-decimated, parallel, uniform channel, hybrid filter bank digital-to-analog converter in accordance with the present invention. A wideband discrete-time input signal u(n) is partitioned into discrete-time subband signals $u_k(n)$ by discrete-time analysis filters $H_k(z)$. The subband signals $u_k(n)$ are downsampled 60 and the resulting downsampled signals $\hat{x}_k(n)$ are converted from discrete-time to continuous-time by a bank of digital-to-analog converters 62. The resulting continuous-time subband signals $\hat{x}_k(t)$ are further processed by continuous-time synthesis filters $F_k(s)$ which generate signals $y_k(t)$ which are the continuous-time approximation of the discrete-time subband signals $u_k(n)$. The continuous-time subband signals $y_k(t)$ may be combined at an adder 64 to form a wideband continuous-time output signal y(t) which is the continuous-time approximation of the discrete-time wideband input signal u(n). Note that the digital-to-analog conversion technique shown in FIG. 6 may be implemented with any of the embodiments described herein, including, but not limited to polyphase decomposition, tree-structure, wavelet structure, subband processing, subband compensation and oversampling.

Figure 7:
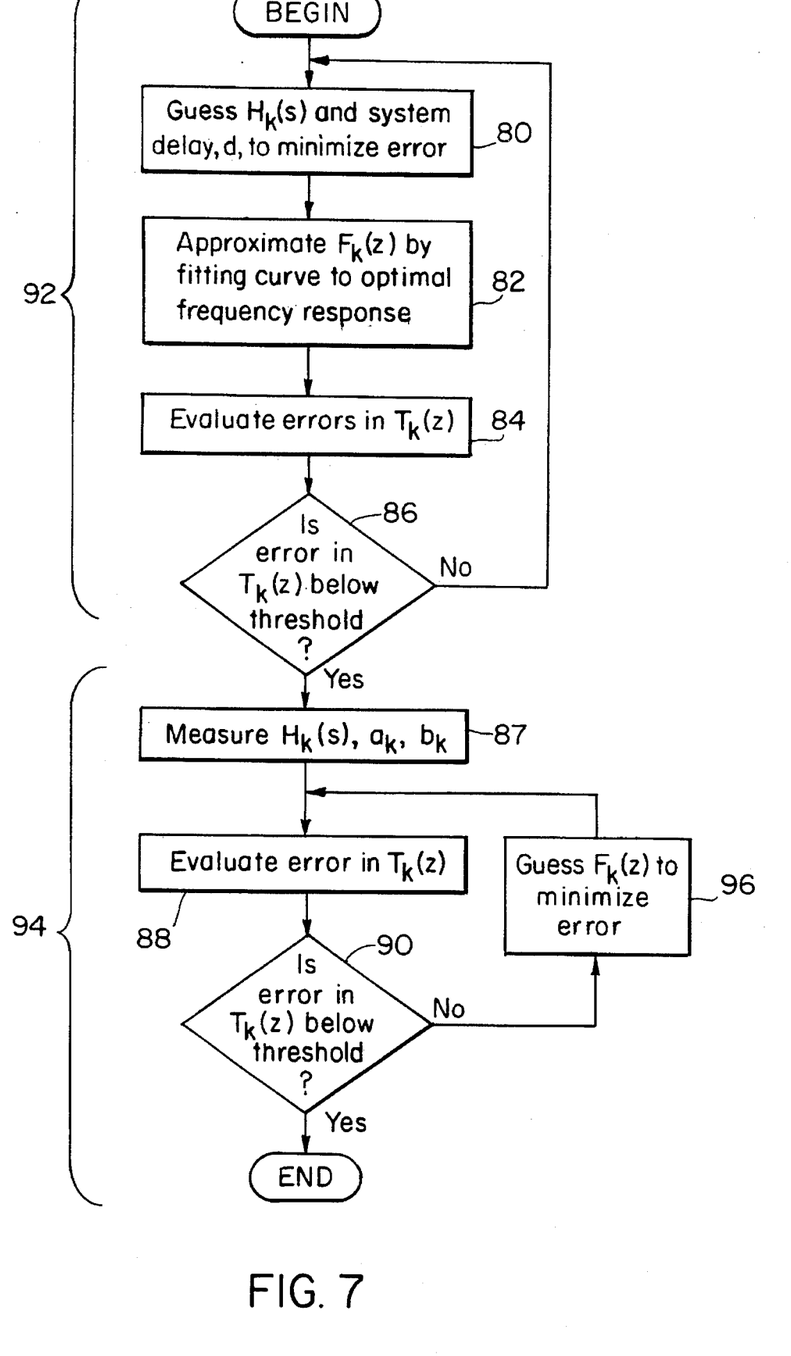
FIG. 7 is a flow diagram for an optimization algorithm for calculating analysis filters $H_k(s)$, and then for calculating discrete time synthesis filters $F_k(z)$ based on the analysis filters for an analog-to-digital converter in accordance with the present invention.

FIG. 7 is a flow diagram of an algorithm for optimizing the analysis filters $H_k(s)$ and synthesis filters $F_k(z)$. The algorithm is broken down into two stages 92, 94. In the first stage 92, analysis filters $H_k(s)$ are calculated and synthesis filters $F_k(z)$ are approximated to minimize reconstruction error. In the second stage 94, the best synthesis filters are calculated to minimize reconstruction error. In each stage, the resulting input/output function for the system is evaluated, assuming that the DC offset errors β in the analog-to-digital converters have been zeroed, and then an error function is calculated. The error function quantifies the difference between the resulting input/output function and an ideal delay. This data is used to make another guess at the filters to reduce reconstruction error. This process repeats until the error is below a prescribed threshold in each stage.

In the first stage 92, a guess is made with a standard multi-variable minimization routine, such as the Matlab™ routine fmins, for the analysis filters $H_k(s)$ and the system delay d, 80. The synthesis filters $F_k(z)$ are then roughly approximated by fitting the frequency response curve to an optimal frequency response 82 using standard filter approximation routines such as the Matlab™ routine invfreqz. The errors in $T_k(e^{j\omega})$ are then evaluated 84 and a determination is made as to whether the error in $T_k(e^{j\omega})$ is below a threshold level 86. If the error is not below threshold 86, then another iteration of the first stage 92 is required and the process continues to adjust the analysis filters $H_k(s)$ with a standard minimization algorithm until the error is below threshold. If the error is below threshold, then the algorithm proceeds to the second stage 94.

In the second stage 94, given analysis filters $H_k(s)$, synthesis filters $F_k(z)$ are calculated which minimize reconstruction error. A measurement of the response of the analysis filters $H_k(s)$ is made 87. Next, the errors in $T_k(e^{j\omega})$ are evaluated 88. A determination is then made as to whether the error in $T_k(e^{j\omega})$ is below a prescribed threshold 90. If the error is not below threshold, then the synthesis filter $F_k(z)$ is adjusted with a standard minimization algorithm to minimize the error 96 and another iteration of the second stage 94 is required. If the error is below threshold 90, then the analysis filters $H_k(s)$ and synthesis filters $F_k(z)$ are determined.

In practice, the frequency response of the analysis filters $H_k(s)$ must be measured 87 to determine their actual transfer functions, since the analysis filters calculated in the first stage 92 of the optimization can never be ideally implemented in hardware. The error function in the optimization algorithm requires accurate analysis filter amplitude and phase data at g equally-spaced frequency points. One approach involves directly measuring the frequency response of the analysis filters at g equally-spaced frequencies. Accurate measurements are required or reconstruction is degraded.

The order of the synthesis filters will have a direct impact on how accurately the ideal solutions can be approximated. For FIR synthesis filters, once the length L has been decided, the initial guess of the optimal delay d of the system can be set to L/2. The rationale for this choice is that the magnitude of the impulse response coefficients is greatest in the vicinity of the $d^{th}$ coefficient and the magnitude tapers off on either side. Choosing d to be one-half of the length of the impulse response assures that the most significant coefficients are not truncated by the finite length of the impulse response.

The analog-to-digital converter gain errors $a_k$ and offset errors $b_k$ must also be measured 87. By measuring the amplitude of the harmonics that the analog-to-digital converter produces when sampling a pure sinusoid, an analog-to-digital converter non-linearity curve can be deduced, where the zero order term corresponds to offset errors $b_k$ which should be nulled to zero, and the first order term corresponds to gain errors $a_k$.

The error function $T_k(e^{j\omega})$ to be minimized must be calculated. As stated above, perfect reconstruction occurs when the only effect of the filter bank architecture is to introduce a delay. Thus, the distortion function $T_0(e^{j\omega})$ should be as close to perfect delay $Ae^{-j\omega d}$ as possible, and the aliasing functions $\epsilon_0(\omega)$, $1 \leq p \leq M-1$, should be as close to zero as possible. $\epsilon_0(\omega)$ is a measurement at a specific frequency ω of the squared difference between the distortion function $T_0(e^{j\omega})$ and an ideal delay $Ae^{-j\omega d}$ (both real and imaginary parts), $$\epsilon_0(\omega) = [\Re\{T_0(e^{j\omega})\} - \Re\{Ae^{-j\omega d}\}]^2 + [z,2\{T_0(e^{j\omega})\} - \Im\{Ae^{-j\omega d}\}]^2. \quad (23)$$

$\epsilon_p(\omega)$ is a measurement at a specific frequency ω of the squared difference between the aliasing function $T_p(e^{j\omega})$ and zero (both real and imaginary parts), $$\epsilon_p(\omega) = \Re\{T_p(e^{j\omega})\}^2 + \Im\{T_p(e^{j\omega})\}^2, 1 \leq p \leq M-1. \quad (24)$$

Therefore, if the system is a perfect delay at frequency ω, both $\epsilon_0(\omega)$ and $\epsilon_p(\omega)$ will be zero. The system should be as close to a perfect delay as possible at all frequencies, so total error function should sample $\epsilon_0(\omega)$ and $\epsilon_p(\omega)$ at g equally-spaced frequencies to assure that optimization occurs across the entire frequency band. The total error function that the algorithm minimizes is $$\epsilon = \sum_{n=0}^{g-1} \sum_{p=0}^{M-1} E_p \epsilon_p \frac{(\pi n)}{g}. \quad (25)$$

where $E_p$ are weighting factors that can be used to favor reduction of either the aliasing error or the distortion error.

The number of frequency points g to be examined in the error function ε must be determined. If L is the length of each synthesis filter, then the minimization program will be operating on a transfer function with ML variables, the L coefficients of the M finite impulse response synthesis filters. If g is chosen as ML, then the input/output function will be relatively smooth between the frequency response measurement points. In other words, the algorithm is reasonably assured of optimizing the response over the entire frequency band, not just at the g frequencies that the algorithm uses. For example, in an M=2 system, if the length of the synthesis filters is chosen to be L=64, then evaluating the $\epsilon$ error function at g=128 equally-spaced frequencies is the minimum recommended.

The total error function $\epsilon$ is a function of analysis filters $H_k(s)$, gain errors $a_k$, and synthesis filters $F_k(z)$. $H_k(s)$ and $a_k$ are first measured, and an initial guess at $F_k(z)$ is made. The minimization of $\epsilon$ in both the first stage 92 and the second stage 94 is done numerically using a routine such as the Matlab™ function fmins, which uses a Nelder-Mead simplex search to iteratively adjust filters $F_k(z)$, $H_k(z)$, or system delay d to minimize the error $\epsilon$. The algorithm is a direct search that does not require derivative information. Let C be the number of variables the algorithm is manipulating to minimize the error. A simplex in C-dimensional space is characterized by the C+1 distinct vectors which are its vertices. In two-space, a simplex is a triangle; in three-space, it is a pyramid. At each step of the search, a new point in or near the current simplex is generated. Error $\epsilon$ evaluated at the new point 84, 88 is compared with the error $\epsilon$ value at the vertices of the simplex, and usually, one of the vertices is replaced by a new point, giving a new simplex 80, 96. This step is repeated until the diameter of the simplex is less than the specified tolerance 86, 90.

An implementation of the Hybrid Filter Bank analog-to-digital converter preferably includes an efficient automatic calibration routine that can be performed on a regular basis. One method of calibration includes injection of a known wideband analog signal into the continuous-time analysis filters, followed by the optimization of the synthesis filters to provide the best mathematical reconstruction of the original continuous-time signal. Measurement and modeling errors will be bypassed using this method because the process is directly optimizing the system based on the performance of the analysis filters. Although the process is computationally intensive, once the initial calibration has been done, re-calibration could be accomplished with a reasonable amount of computation on a regular basis. The computational requirements of the M-channel case can be reduced by simplifying the architecture to form a series of recursive two channel blocks arranged in a tree structure as shown in FIG. 5A.

The analysis filter type affects the accuracy of the synthesis filter reconstruction. Reconstruction accuracy is also a function of the order, ripple, and group delay of the analysis filters. In addition to analysis filters designed by the first stage 92 of the optimization algorithm, experiments have been conducted on several standard types of analysis filters including Elliptic, Chebyshev I, and Butterworth. The experiments demonstrated that reconstruction accuracy is nearly independent of analysis filter order. However, low order analysis filters with greater stopband attenuation generated greater out-of-band attenuation of analog-to-digital converter linearity errors and quantization errors. These errors are compounded across the subband channels similar to the compounding of errors in time-interleaved analog-to-digital converters, thereby increasing overall distortion. Note that this analog-to-digital converter error should not be confused with the mathematical reconstruction error of the hybrid bank structure discussed above. Filters with passband ripple and non-constant group delay, such as Chebyshev and Elliptic filters, have lower reconstruction accuracy. Better reconstruction was achieved with Butterworth filters since they have no passband ripple and since group delay is relatively constant. The best analysis filters were designed with the first stage 92 of the optimization algorithm.

The synthesis filters reconstruct the signal by suppressing upsampled images, cancelling aliasing and compensating for the analysis filter ripple and nonlinear phase. The order of the synthesis filter determines how accurately the objectives are met. Increasing the analysis filter cut-off slope and stopband attenuation decreases the amount of aliasing. This alleviates the requirements imposed on synthesis filters to cancel aliasing, thereby improving reconstruction accuracy. This also increases out-of-band attenuation, which suppresses linearity errors and quantization noise between the frequency bands.

A two channel hybrid filter bank system employing seventh order analog Butterworth analysis filters and length 64 finite impulse response 16-bit digital synthesis filters optimized by the second stage 94 of the optimization algorithm was simulated. The system exhibited 0.113 dB average deviation from 0 dB distortion (3.13 dB peak distortion at $\omega=\pi$ rad/s), −81.5 dB average aliasing (−42.1 dB peak aliasing at $\omega=0$ rad/s), and almost constant group delay of 32 samples. Errors were concentrated near $\omega=0$ and $\omega=\pi$ and did not severely limit the useful bandwidth of the system. Aliasing was cancelled below −68 dB over 93% of the spectrum. The signal-to-noise ratio of an ideal n-bit analog-to-digital converter is 6.02n+1.76 dB, so the system is capable of analog-to-digital conversion at approximately 11 bits of resolution because the aliasing errors would be at the noise floor of the system.

A system with seventh-order analysis filters optimized by the first stage 92 and length 64, 16-bit coefficient FIR digital synthesis filters optimized by the second stage 94 was simulated. The optimized system demonstrated 0.00095 dB average deviation from 0 dB distortion (0.0045 dB peak distortion), −108 dB average aliasing (−42.3 dB peak aliasing at $\omega=0$ rad/s), and an almost constant group delay of 34 samples. Aliasing was cancelled below −74 dB over 95% of the spectrum, so the optimized hybrid filter bank is capable of analog-to-digital conversion at approximately 12 bits of resolution. Results from the filter design algorithm indicate that the mean-squared reconstruction error for the Butterworth hybrid filter bank is 46 times larger than that of the optimized filter bank.

Results from a simulation with wideband input reveal approximately 30 dB out-of-band attenuation. This illustrates how the linearity errors and analog-to-digital converter mismatches of each of the analog-to-digital converters in the array are suppressed by about 30 dB between the channels and are therefore not compounded as in time-interleaved analog-to-digital conversion. For example, a 50 MSa/s time-interleaved system using two 12-bit 25 MSa/s analog-to-digital converters was evaluated. Because of mismatches between the analog-to-digital converters, the system's spurious-free dynamic range was only 56.7 dB, or 9.1 bits. The corresponding two-channel 50 MSa/s hybrid filter bank analog-to-digital converter does not compound the mismatches, so the resolution was limited by the worst analog-to-digital converter in the array, which in this case had a spurious-free dynamic range of 82.2 dB, or 13.4 bits.

It is expected that a fully-developed hybrid filter bank analog-to-digital converter would exceed 8 GSa/s sampling rate at 8 bits resolution, and would exceed 2 MSa/s sampling rate at 16 bits resolution.

The filter design algorithm optimizes the analog analysis filters and digital synthesis filters to cancel aliasing and compensate for ripple, non-linear phase, and imperfect implementations of the analog analysis filters to form a near-perfect-reconstruction hybrid filter bank. The hybrid filter bank isolates the analog-to-digital converters in the array so that analog-to-digital errors are not compounded between the channels, thereby improving speed and resolution over conventional array architectures. Although the experiment focused on an analog-to-digital system, the optimization algorithm is equally applicable to the digital-to-analog case.

Further details of an implementation of the invention can be found in the Massachusetts Institute of Technology M.S. Thesis of Scott Richard Velazquez, 1994, which is incorporated herein by reference.

While this invention has been particularly shown and describe with references to preferred embodiments thereof, it will be understood by those skilled in the art that various changes in form and details may be made therein without departing from the spirit and scope of the invention as defined by the appended claims.

We claim:

1. A system for converting a signal between continuous-time and discrete-time comprising:
    an analysis filter bank for partitioning a wideband input signal into first subband signals;
    a converter bank of analog/digital converters for converting the first subband signals to second subband signals;
    a synthesis filter bank for reconstructing the second subband signals such that third subband signals are generated which are the converted approximation of the first subband signals; and
    wherein one of the analysis bank and synthesis bank comprises continuous-time filters and the other comprises discrete-time filters.

2. The system of claim 1 further comprising an adder for recombining the third subband signals into a wideband output signal which is the converted approximation of the wideband input signal.

3. The system of claim 1 wherein the analysis filters and the synthesis filters are determined by an optimization technique which iteratively adjusts the analysis and synthesis filters such that the system distortion function converges on a perfect delay and such that the system aliasing functions converge on zero.

4. The system of claim 1 implemented in a maximally decimated architecture.

5. The system of claim 1 wherein polyphase decomposition is employed such that filtering is accomplished at the lowest data rate.

6. The system of claim 1 wherein the bank of analog/digital converters includes a subset of analog/digital converters operating at a higher resolution than the remaining analog/digital converters.

7. The system of claim 1 wherein the bandwidth of the subbands is non-uniform.

8. The system of claim 1 wherein the first subband signals are oversampled by the analog/digital converters for increasing resolution.

9. The system of claim 1 implemented in a tree-structured architecture.

10. The system of claim 1 implemented in a wavelet architecture.

11. The system of claim 1 wherein the analysis filter bank comprises continuous-time filters, the converter bank comprises analog-to-digital converters, and the synthesis filter bank comprises discrete-time filters.

12. The system of claim 1 wherein the analysis filter bank comprises discrete-time filters, the converter bank comprises digital-to-analog converters, and the synthesis filter bank comprises continuous-time filters.

13. The system of claim 1 further comprising a mixing circuit for mixing the first subband signals down to baseband or up to higher frequencies.

14. The system of claim 1 wherein the discrete-time filters compensate for non-ideal analog behavior in the continuous-time filters.

15. A system for converting a continuous-time signal to a discrete-time signal comprising:
    a bank of continuous-time analysis filters for partitioning a continuous-time wideband input signal into subband signals;
    a bank of analog-to-digital converters for quantizing the subband signals;
    a bank of rate changers for adjusting the data rate of the subband signals; and
    a bank of discrete-time synthesis filters for reconstructing the subband signals such that signals are generated which are the discrete-time approximation of the continuous-time subband signals.

16. The system of claim 15 further comprising an adder for recombining the subband signals into a wideband output signal which is the discrete-time approximation of the continuous-time wideband input signal.

17. The system of claim 15 wherein the analysis filters and the synthesis filters are determined by an optimization technique which iteratively adjusts the analysis and synthesis filters such that the system distortion function converges on a perfect delay and such that the system aliasing functions converge on zero.

18. The system of claim 15 further comprising a bank of discrete-time compensators for compensating for non-ideal analog behavior in the analog-to-digital converters.

19. The system of claim 15 further comprising a bank of application specific processors for further processing of the subband signals.

20. The system of claim 19 wherein subband processing is performed before or after or both before and after the analog-to-digital converters quantize the subband signals.

21. The system of claim 15 implemented in a maximally decimated architecture.

22. The system of claim 15 wherein polyphase decomposition is employed such that synthesis filtering is accomplished at the lowest data rate.

23. The system of claim 15 wherein the bank of analog-to-digital converters includes a subset of analog-to-digital converters operating at a higher resolution than the remaining analog-to-digital converters.

24. The system of claim 15 wherein the bandwidth of the subbands is non-uniform.

25. The system of claim 15 wherein the subband signals are oversampled by the analog-to-digital converters for increasing resolution.

26. The system of claim 15 implemented in a tree-structured architecture.

27. The system of claim 15 implemented in a wavelet architecture.

28. The system of claim 15 further comprising a mixing circuit for mixing the continuous-time subband signals down to baseband.

29. A method for converting a signal between continuous-time and discrete-time comprising:
    partitioning a wideband input signal into first subband signals at an analysis filter bank;

converting the first subband signals to second subband signals at a bank of analog/digital converters; and reconstructing the second subband signals at a synthesis filter bank such that third subband signals are generated which are the converted approximation of the first subband signals and wherein one of the analysis bank and synthesis bank comprises continuous-time filters and the other comprises discrete-time filters.

30. The method of claim 29 further comprising the step of recombining the third subband signals into a wideband output signal which is the converted approximation of the wideband input signal.

31. The method of claim 29 further comprising the step of optimizing the analysis filters and the synthesis filters by iteratively adjusting the analysis and synthesis filters such that the system distortion function converges on a perfect delay and such that the system aliasing functions converge on zero.

32. The method of claim 29 wherein polyphase decomposition is employed such that analysis or synthesis filtering is accomplished at the lowest data rate.

33. The method of claim 29 further comprising the step of operating a subset of analog/digital converters at a higher resolution than the remaining analog/digital converters.

34. The method of claim 29 further comprising the step of oversampling the subband signals at the analog/digital converters for increasing resolution.

35. The method of claim 29 wherein the analysis filter bank comprises continuous-time filters, the analog/digital converter bank comprises analog-to-digital converters, and the synthesis filter bank comprises discrete-time filters.

36. The method of claim 29 wherein the analysis filter bank comprises discrete-time filters, the analog/digital converter bank comprises digital-to-analog converters, and the synthesis filter bank comprises continuous-time filters.

37. The method of claim 29 further comprising the step of mixing the continuous-time subbands down to baseband or up to higher frequencies.

38. A method for converting a continuous-time signal to a discrete-time signal comprising the steps of:

partitioning a continuous-time wideband input signal into subband signals at a bank of continuous-time analysis filters:

quantizing the subband signals at a bank of analog-to-digital converters;

adjusting the data rate of the subband signals at a bank of rate changers; and reconstructing the subband signals at a bank of discrete-time synthesis filters for generating signals which are the discrete-time approximation of the continuous-time subband signals.

39. The method of claim 38 further comprising the step of recombining the subband signals into a wideband output signal which is the discrete-time approximation of the continuous-time wideband input signal.

40. The method of claim 38 further comprising the step of optimizing the analysis filters and the synthesis filters by iteratively adjusting the analysis and synthesis filters such that the system distortion function converges on a perfect delay and such that the system aliasing functions converge on zero.

41. The method of claim 38 further comprising the step of compensating for non-ideal analog behavior in the analog-to-digital converters at a bank of discrete-time compensators.

42. The method of claim 38 further comprising the step of processing the subband signals further at a bank of application specific processors.

43. The method of claim 42 wherein the step of processing is performed before or after or both before and after the analog-to-digital converters quantize the subband signals.

44. The method of claim 38 wherein the steps of adjusting the data rate and reconstructing the subband signals are employed in polyphase decomposition such that synthesis filtering is accomplished at the lowest data rate.

45. The method of claim 38 further comprising the step of operating a subset of analog-to-digital converters at a higher resolution than the remaining analog-to-digital converters.

46. The method of claim 38 further comprising the step of oversampling the subband signals at the analog-to-digital converters for increasing resolution.

47. The method of claim 38 further comprising the step of mixing the continuous-time subbands down to baseband.

48. In a data processing system, a method of generating a system for converting a signal between discrete-time and continuous-time comprising:

estimating a bank of continuous-time filters;

implementing the bank of continuous-time filters;

measuring the behavior of the continuous-time filter bank implementation;

estimating a bank of discrete-time filters to compensate for non-ideal behavior in the continuous-time filter bank implementation; and adjusting the discrete-time filters such that the system distortion function converges on a perfect delay and such that the system aliasing function converges on zero.

49. The method of claim 48 wherein the conversion is from continuous-time to discrete-time.

* * * * *

UNITED STATES PATENT AND TRADEMARK OFFICE
CERTIFICATE OF CORRECTION

PATENT NO. : 5,568,142
DATED : October 22, 1996
INVENTOR(S) : Scott R. Velazquez, Truong Q. Nguyen, and Steven R. Broadstone It is certified that error appears in the above-indentified patent and that said Letters Patent is hereby corrected as shown below:

Title page, Item [75], & column 1, "Truong O. Nguyen" should be ---Truong Q. Nguyen---.

Signed and Sealed this

Thirty-first Day of December, 1996

Attest:

BRUCE LEHMAN

*Attesting Officer*    *Commissioner of Patents and Trademarks*